United States Patent [19]

Scheps

[11] Patent Number: 5,764,677
[45] Date of Patent: Jun. 9, 1998

[54] LASER DIODE POWER COMBINER

[75] Inventor: Richard Scheps. Del Mar, Calif.

[73] Assignee: The United States of America as represented by the Secretary of the Navy. Washington, D.C.

[21] Appl. No.: 572,828

[22] Filed: Dec. 14, 1995

Related U.S. Application Data

[63] Continuation-in-part of Ser. No. 299,865, Sep. 1, 1994, Pat. No. 5,530,711.

[51] Int. Cl.$^6$ .............. H01S 3/20; H01S 3/10; H01S 3/091; H01S 3/08

[52] U.S. Cl. .............. 372/54; 372/20; 372/75; 372/92

[58] Field of Search .............. 372/53, 69, 70, 372/75, 92, 54, 20, 32, 98, 99; 385/24, 36; 359/117, 124, 129

[56] References Cited

U.S. PATENT DOCUMENTS

| | | | |
|---|---|---|---|
| 3,913,033 | 10/1975 | Tuccio et al. | 372/36 |
| 4,627,068 | 12/1986 | Johnson et al. | |
| 4,933,949 | 6/1990 | Johnson | |
| 5,181,223 | 1/1993 | Baer | |
| 5,185,758 | 2/1993 | Fan et al. | 372/71 |
| 5,299,221 | 3/1994 | Kaneda | |
| 5,347,525 | 9/1994 | Faris | 372/23 |
| 5,369,661 | 11/1994 | Yamaguchi et al. | |
| 5,463,649 | 10/1995 | Ashby et al. | |

OTHER PUBLICATIONS

Hecht, Understanding Lasers: An Entry–Level Guide, 2nd ed., New York: IEEE Press, 1994, pp. 299–301. (no month available).

Scheps, "Low–Threshold Dye Laser Pumped by Visible Laser Diodes," IEEE Photonics Technology Letters, vol. 5, No. 10, pp. 1156–1158, Oct. 1993.

Benfey, D.P. et al., "Continuous Wave Visible Diode–Pumped Dye Laser", SPIE: Visible And UV Lasers, vol. 2115, pp. 204–212, Jan. 25, 1994.

"Low Threshold, diode-pumped dye laser", Richards Scheps, SPIE vol. 2115 Visible and UV Lasers (1994)pp.213–218 (no month availabe).

Proceedings, SPIE —The International Society for Optical Engineering, "Visible and UV Lasers", Richard Scheps (Jan. 1994).

*Primary Examiner*—Rodney B. Bovernick
*Assistant Examiner*—Luong-Quyen T. Phan
*Attorney, Agent, or Firm*—Harvey Fendelman; Michael A. Kagan; Eric James Whitesell

[57] ABSTRACT

A laser diode power combiner comprises a dye laser operably coupled to an array of laser diodes for combining optical power from the laser diodes into a single, coherent laser beam.

12 Claims, 1 Drawing Sheet

LASER DIODE POWER COMBINER

CROSS-REFERENCE TO RELATED APPLICATIONS

This application is a continuation-in-part of U.S. application Ser. No. 08/299,865 filed Sep. 1, 1994 titled LOW THRESHOLD DIODE-PUMPED TUNABLE DYE LASER, now U.S. Pat. No. 5,530,711 issued on Jun. 25, 1996.

BACKGROUND OF THE INVENTION

The present invention relates to sources of high power laser diode beams. More specifically, but without limitation thereto, the present invention relates to a device for combining the power of several laser diodes into a single coherent laser beam.

Laser diode output power is limited by the saturation intensity and the laser diode facet damage threshold. The saturation intensity is the maximum power that can be produced per unit cross-sectional area. The saturation intensity for a given laser is equal to $I_{SAT}=h\nu/\sigma\tau$, where $I_{SAT}$ is the saturation intensity, $\sigma$ is the stimulated emission cross section, $h\nu$ is the photon energy, and $\tau$ is the fluorescence lifetime of the laser gain element material. For laser diodes, the cross-sectional area is typically the stripe width times the effective aperture depth, typically 1 μm. The maximum stripe width is limited to about 200 μm, since wider stripes tend to break into "filaments" that do not produce single, coherent laser emission. The maximum cross sectional area for a laser diode is thus about $2\times10^{-6}$ cm$^2$.

When the signal intensity passing through the laser gain element is on the order of the saturation intensity, only a relatively small additional amount of gain is realized. For laser diodes, the saturation intensity limits the output power to approximately 10 mW per micron of stripe width.

The output power of the laser diode is also limited by the damage threshold of the laser diode facets. For most coated diode facets, the damage threshold is about 1 MW/cm$^2$. This limit is similar to the saturation intensity limit and corresponds to about 10 mW per micron of diode stripe width. For a nominal stripe width of 100 μm, the maximum output power is about 1 W. If an application requires higher cw laser diode power, the output powers of several diodes have to be combined. One technique used in the art is to simply produce multiple laser diodes on a single semiconductor chip. For example, an "array" of laser diodes can be produced by lithographic techniques. A typical example of such an array comprises parallel 100 μm wide stripe diodes spaced by 250 μm. This arrangement yields four 1-Watt lasers per mm of chip width, or 40 W per cm. A limitation of this linear array is that adjacent lasers are neither in phase nor have the same wavelength, so that the combined output from the array is not coherent. An additional problem is that the focusing properties of this type of array are different from that of a single laser diode. Using standard optics on the output of the array produces a demagnified image of the emitting facets in the focal plane, rather than a single focused spot. Using the 1 mm array as an example, collimating and focusing the output of the array produces an image of four spots in the focal plane. The overall size of the image depends on the system magnification.

Another well known technique for laser diode combination is polarization combination. This method exploits the property that laser diodes have of emitting linearly polarized light. Using a polarization beam combining device, the output of two single stripe laser diodes may be combined to produce a single beam having the power of two diodes. This technique has the advantage of producing a beam that may be focused into a single, small diameter spot and may be used for end-pumping solid state lasers, for example. However, the output beam contains two outputs that are neither at the same wavelength nor coherent (that is, in phase) with one another. In addition, the polarizations of the two outputs are orthogonal.

Another technique for combining the output of multiple, discrete laser diodes collimates the outputs of a linear array of diodes by an array of "micro lenses" 172 as shown with diode array 130 in FIG. 1. This technique produces a linear array of collimated output beams. These beams may be focused into a single spot, but the beam is not coherent and contains multiple wavelengths.

Yet another technique for combining diode output power is called "injection locking". In this technique the output of a single mode "master oscillator" is directed to the end facet of one or more "slave" laser diodes. This injected signal forces the slave laser diode to oscillate at the same wavelength and in phase with the output of the master oscillator. The result of injection locking is a single, coherent high power laser diode beam. In this technique alignment is critical, since the master oscillator must be directed into a small (approximately 1 μm by 100 μm) area which is determined by the slave laser's facet size. In addition, the slave laser must have gain at the injected laser wavelength. Since the gain bandwidth of AlGaAs laser diodes is only a few nm while the range of output wavelengths for laser diodes is typically 3 to 10 nm, diode selection is an important factor in this technique. Injection-locked outputs are monochromatic and coherent. However, the maximum demonstrated output power of an injection locked system is about 1 W, which is generally not high enough for many important applications.

Still another technique for combining laser diode power uses a wavelength dispersive device such as a diffraction grating or a prism. In this technique, laser diodes emitting at different wavelengths are arranged and oriented in such a manner that the wavelength dispersive device, which for this purpose operates "backwards" as a wavelength combining device, combines the output of the diodes into a single beam containing all of the power and all of the wavelengths of the individual devices. A problem with this technique is that the diodes must be preselected to emit predetermined wavelengths. In addition, alignment requires that each diode operate at a fixed wavelength. Since the exact wavelength produced by a laser diode depends on the temperature and, more importantly, the output power that the diode is producing (or equivalently, the electrical current used to drive the diode), there is little room for parametric variation of the power from each of the diodes. Also, aging effects produced by operating the diode for many hours at a time shifts the output wavelength. This has the effect of uncoupling the alignment of the device.

A need thus exists for a power combiner for laser diodes that efficiently combines the laser diode output power into a single coherent output beam at a single wavelength.

SUMMARY OF THE INVENTION

A laser diode power combiner of the present invention is directed to overcoming the problems described above, and may provide further related advantages. No embodiment of the present invention described herein should be construed to preclude other embodiments or advantages that may exist or become obvious to those skilled in the art.

A laser diode power combiner of the present invention comprises a dye laser operably coupled to an array of laser diodes for combining the optical power of the laser diodes into a single, coherent laser beam.

An advantage of the laser diode power combiner is that a single coherent laser beam may be generated that combines the power of multiple laser diodes.

Another advantage is that laser power from laser diodes of different wavelengths may be combined into a beam having a single wavelength.

Still another advantage is that the wavelength of the combined output power may be selected to be close to that of the laser diodes.

Yet another advantage is that the laser diode beams may be combined by angular multiplexing.

The features and advantages summarized above in addition to other aspects of the present invention will become more apparent from the description accompanied by the following drawings.

DESCRIPTION OF THE INVENTION

Figure 1:
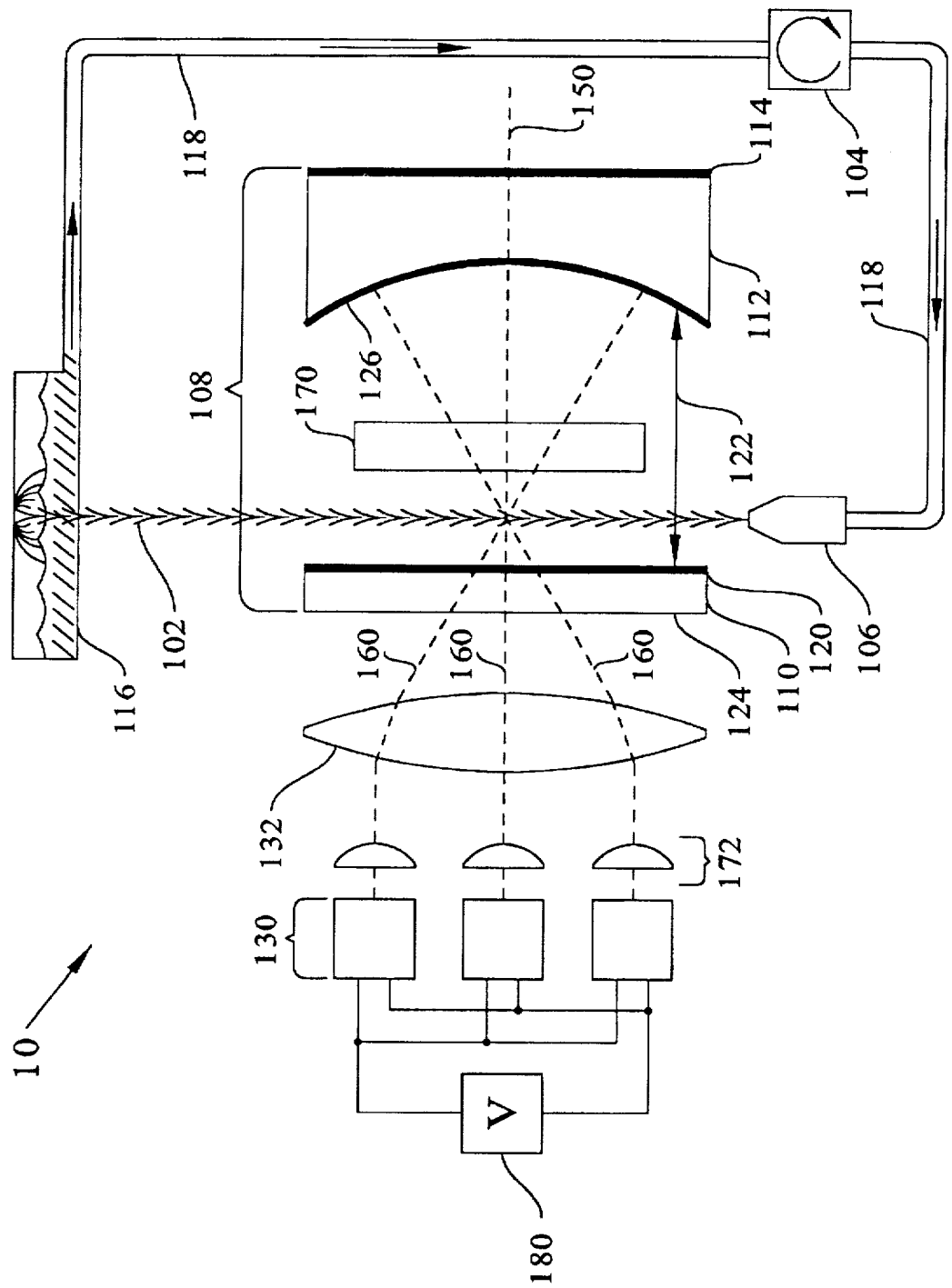
FIG. 1 is diagram of a laser diode power combiner of the present invention.

The following description is presented solely for the purpose of disclosing how the present invention may be made and used. The scope of the invention is defined by the claims.

A laser diode pumped dye laser may be tunable over a wavelength band and may operate in a continuous (cw) or pulsed mode. The dye may be placed in an optical cell, or caused to flow in a transverse direction with respect to the laser resonator mode axis as a sheet of fluid under pressure from a jet nozzle, or it may take the form of a solid state dye-containing gain medium. The laser gain medium may be contained in an optical thin film on a substrate, or the dye may be dissolved or distributed in a solid state host such as a glass, gel, or plastic.

The present invention incorporates a dye laser as a laser diode power combiner. The output of a plurality of laser diodes illuminates a dye gain element contained in a laser resonator cavity. The dye gain element absorbs the emission from each laser diode and produces a single mode laser output beam. The dye laser absorption bandwidth is broad, so that laser diode emission contained within a range of more than 10 nm can be effectively absorbed by the dye and converted into single mode laser output. In addition, the difference in wavelength between the dye laser output and laser diode wavelengths can be as little as 20 nm. Therefore multiple diode wavelengths can be converted into a single laser output wavelength that is shifted to longer wavelengths by only a small amount. The optical conversion efficiency, which is the fraction of incident laser diode power that is converted to dye laser power, typically exceeds 50%. Due to the high linear absorption coefficient of the dye and the small thickness of the dye gain element, multiple laser diodes may be focused onto the dye gain element at very large angles. Each focused diode beam need only be aligned to coincide with a two-dimensional focusing spot on the dye. Divergence of the diode beams beyond the focus spot, caused by large angles of incidence, thus does not affect the efficiency of the laser diode power combiner. In addition, laser diodes 130 may be angularly multiplexed as shown in FIG. 1 to combine their power into a single active volume from varying angles of incidence.

The wavelength range over which the laser system operates is determined by the nature of the laser gain element as well as by the reflective coatings and the spectral transmission of the optical elements contained within the laser resonator cavity. The laser resonator cavity may be end pumped by laser diodes. End pumping, or longitudinal pumping, is a technique for optically exciting a laser gain element by pumping along the optical feedback axis. The optical feedback axis defines the reflective path for intracavity radiation. Side pumping, which is also called transverse pumping, describes a means for optically exciting a laser gain element by pumping in a direction transverse to the laser resonator axis.

In FIG. 1, laser diode power combiner 10 comprises a tunable dye laser 108. A fluid dye jet 102 is produced by, for example, a liquid pump 104 which pumps dye from a reservoir 116 through a thin, approximately rectangular nozzle aperture 106 to produce dye jet 102. A laser resonator 108 comprises an end reflective element 110 and an output coupler reflective element 112 optically aligned in a reflective path with end reflective element 110 to form a laser resonator cavity 122. A typical spacing for laser resonator cavity 122 is about 100 mm. Output coupler reflective element 112 may have, for example, a 10 cm radius of curvature corresponding to the spacing from end reflective element 110. End reflective element 110 may be, for example, a highly reflective flat mirror.

Interior face 120 of end reflective element 110 may be coated to be highly reflective at the wavelength of laser output 150 and highly transmissive at the wavelengths of laser diode outputs 160. A focusing lens 132 both angularly multiplexer and concentrates collimated laser diode outputs 160 from collimator 172, causing laser diode outputs to converge angularly from lens 132 through end reflective element 110 and to focus onto fluid dye jet 102. An exterior face 114 of output coupler reflective element 112 may be uncoated or coated to be anti-reflective at the wavelengths of laser diode outputs 160. For AlGaInP laser diodes this wavelength range covers approximately 610 nm to 690 nm. An interior face 126 of output reflective element 112 is preferably coated to be at least 80% reflective at the wavelength of laser output 150 for cw operation.

In addition, interior face 126 of output coupler reflective element 112 and interior face 120 of end reflective element 110 have a high quality optical finish polished to one-tenth wavelength or better. The spacing between exterior face 124 and interior face 120 should be as small as possible to allow focusing lens 132 to be located as close as possible to dye jet 102. The focal length of focusing lens 132 is chosen to focus laser diode outputs 160 on or near dye jet 102. For example, a 14 mm focal length lens may be used to produce a pump spot diameter of 36 µm on dye jet 102. End reflective element 110 may be, for example, 25 mm in diameter, 2 millimeters thick, and made of high quality fused silica.

The orientation of dye jet 102 is preferably normal to the axis of laser output 150 and spaced as close as possible to end reflective element 110 without causing splashing of dye solution comprising dye jet 102 on interior face 120 of end reflective element 110. By way of example, the spacing may be approximately 400 µm.

The thickness of dye jet 102 is partly a function of the dye solution temperature, the dye pressure produced by liquid pump 104 at rectangular nozzle aperture 106, and the physical dimensions of dye nozzle 106. A typical value for the thickness of dye jet 102 is 100 µm. Reservoir 116 is oriented to receive dye jet 102 from dye nozzle 106 and to transport the dye solution back to a dye solution pump 104 through collector tubes 118.

Since the passive power loss in dye jet 102 increases with increasing dye concentration, it is desirable to use as low a dye concentration as practical. With a typical dye concentration, approximately 80% to 90% of optical power of laser diode outputs 160 are absorbed by dye jet 102. AlGaInP visible laser diodes, for example, may be used for laser diode array 130. Electrical power from an electrical power source 180 drives laser diode array 130. The electrical power to laser diode array 130 may also be varied to modulate the amplitude of the output of laser diode array 130 for amplitude modulating the dye laser output. An initial dye concentration may be used as described in various commercial manuals for pumping with krypton ion lasers. The dye concentration may then be adjusted as the dye laser is operating by adding more solvent or more concentrated dye solution as appropriate to the dye solution circulating in reservoir 116. The optimum dye concentration may be realized by observing when a minimum occurs in the laser threshold power. By way of example, the optimum concentration may occur when 70% of laser diode outputs 160 are absorbed in a single pass using a concentration of $1.76 \times 10^{-3}$ molar rhodamine 700 dye dissolved in ethylene glycol maintained at a temperature of 12° C. The coating on interior face 120 of end reflective element 110 may be, for example, HR from 720 nm to 850 nm and highly transmissive (HT) from 650 nm to 680 nm. Interior face 126 of output coupler reflective element 112 may be coated to be HR at 650 nm to 680 nm and partially reflective from 700 nm to 800 nm to produce a net gain peak.

The temperature of the dye solution may be maintained by, for example, a thermoelectric cooler. If a non-flowing gain element is used, such as a dye-containing polymer host, then cooling may be accomplished by cooling the host directly with a thermoelectric cooler, for example.

The wavelength of dye laser output 150 is dependent on the spectral reflectivity of end reflective element 110 and output coupler reflective element 112 as well as on the spectral dependence of the gain. Various coatings may be used on end reflective element 110 and output coupler reflective element 112 to shift the central wavelength of output 150 over a range of approximately 14 nm.

For applications where a specific wavelength is desired within the tuning bandwidth of a particular dye, end reflective element 110 and output coupler reflective element 112 may be coated to produce a peak in the net gain at the specific wavelength. In this arrangement, no additional tuning elements are required within laser resonator cavity 122. For applications where continuous tunability or frequency modulation is desired, a discrete tuning element 170 made according to techniques well known in the art may be used within laser resonator cavity 122.

In the example illustrated in FIG. 1, laser diodes 130 emit at about 670 nm, 675 nm and 680 nm, respectively. Each laser diode emits approximately 1 W of output power. Dye jet 102 contains a solution of, for example, rhodamine 700. Output 150 typically has 1.5 W of single mode laser power at 700 nm. The angles of incidence of laser diode outputs 160 with respect to the axis of dye jet 102 do not affect the efficiency of the laser diode power combiner because of the small thickness of dye jet 102 and the selection of dye concentration.

Other dyes with different spectral properties may be used for dye jet 102, such as oxazine 750, DOTCI, and oxazine 1. Common synonyms used by various manufacturers for these dyes are: LD 700 for rhodamine 700, oxazine 725 for oxazine 1 and DOTC or DOTC-iodide for DOTCI.

Other modifications, variations, and applications of the present invention may be made in accordance with the above teachings other than as specifically described to practice the invention within the scope of the following claims.

I claim:

1. A laser diode power combiner comprising:
   an array of laser diodes;
   a dye laser comprising a dye gain element, an end reflective element coupled to said dye gain element, and an output coupler coupled to said dye gain element; and
   a lens coupled to said array of laser diodes and to said end reflective element of said dye laser for angularly multiplexing optical power of said array of laser diodes through said end reflective element onto said dye gain element to generate a single, coherent laser output beam.

2. The laser diode power combiner of claim 1, wherein said dye gain element comprises a dye that is at least one of rhodamine 700, oxazine 1, oxazine 725, and DOTCI.

3. The laser diode power combiner of claim 1, wherein said dye gain element comprises a host that is at least one of a jet stream, solid state, thin film, polymer plastic, glass, and gel.

4. The laser diode power combiner of claim 1, further including an electrical power source coupled to said array of laser diodes.

5. The laser diode power combiner of claim 1, further comprising an amplitude modulator coupled to said array of laser diodes for amplitude modulating said laser output beam.

6. The laser diode power combiner of claim 1, further comprising a wavelength tuner operably coupled to tune said output laser beam over a band of wavelengths.

7. The laser diode power combiner of claim 1 further comprising a collimator coupled to said array of laser diodes.

8. The laser diode power combiner of claim 1, further comprising a coating on at least one of said end reflective element and said output coupler for producing a net gain peak for said dye gain element at an output wavelength.

9. The laser diode power combiner of claim 1, wherein said dye laser comprises a dye jet having a thickness and a dye concentration selected for absorbing a substantial percentage of said optical power of said laser diodes.

10. The laser diode power combiner of claim 1, wherein said optical power of said laser diodes is angularly multiplexed.

11. The laser diode power combiner of claim 1 wherein said lens focuses said optical power.

12. A laser diode power combiner comprising:
    an array of laser diodes:
    a dye laser comprising a dye gain element, an end reflective element coupled to said dye gain element, and an output coupler coupled to said dye gain element;
    a lens coupled to said array of laser diodes and to said end reflective element of said dye laser for angularly multiplexing optical power of said array of laser diodes through said end reflective element onto said dye gain element to generate a single, coherent laser output beam;
    a wavelength tuner coupled to tune said laser output beam over a band of wavelengths;
    a collimator coupled to said array of laser diodes; and
    a coating on at least one of said reflective element and said output coupler for producing a net gain peak for said dye gain element at an output wavelength of said laser output beam, wherein:
    said dye gain element comprises a dye jet having a thickness and a dye concentration selected for absorbing a substantial percentage of said optical power of said laser diodes.

* * * * *